(12) United States Patent
Na

(10) Patent No.: US 9,601,173 B2
(45) Date of Patent: Mar. 21, 2017

(54) SEMICONDUCTOR SYSTEM

(71) Applicant: SK hynix Inc., Gyeonggi-do (KR)

(72) Inventor: Kwang Jin Na, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/673,262

(22) Filed: Mar. 30, 2015

(65) Prior Publication Data

US 2015/0206563 A1 Jul. 23, 2015

Related U.S. Application Data

(62) Division of application No. 13/308,843, filed on Dec. 1, 2011, now abandoned.

(30) Foreign Application Priority Data

Sep. 23, 2011 (KR) .................. 10-2011-0096135

(51) Int. Cl.
*G11C 8/18* (2006.01)
*G11C 7/20* (2006.01)
*G11C 7/22* (2006.01)
*G11C 29/02* (2006.01)

(52) U.S. Cl.
CPC .................. *G11C 8/18* (2013.01); *G11C 7/20* (2013.01); *G11C 7/222* (2013.01); *G11C 29/022* (2013.01); *G11C 29/023* (2013.01)

(58) Field of Classification Search
CPC .................. G11C 7/22; G11C 7/1072
USPC .................. 365/233.11, 233.1, 233
See application file for complete search history.

(56) References Cited

U.S. PATENT DOCUMENTS

| | | | |
|---|---|---|---|
| 6,438,060 B1* | 8/2002 | Li | G11C 5/14 365/189.05 |
| 6,946,870 B1* | 9/2005 | Lesea | H03K 19/00346 326/38 |
| 7,319,349 B2* | 1/2008 | Tomita | G06F 1/12 327/144 |
| 7,639,552 B2* | 12/2009 | Ku | G11C 7/12 327/156 |
| 2005/0254337 A1* | 11/2005 | Lee | G11C 7/1045 365/233.1 |
| 2007/0025175 A1* | 2/2007 | Liu | G11C 7/1012 365/233.11 |

\* cited by examiner

*Primary Examiner* — Son Dinh
*Assistant Examiner* — Uyen B Tran
(74) *Attorney, Agent, or Firm* — I P & T Group LLP

(57) ABSTRACT

A semiconductor system includes a first clock channel and a second clock channel. The first clock channel transmits a first clock signal from a controller to a memory. The second clock channel transmits a second clock signal with a phase difference of 90° from the first clock signal, from the controller to the memory.

14 Claims, 4 Drawing Sheets

HCLK0

HCLK180

WCLK0

WCLK90

WCLK180

WCLK270

CLK0

CLK90

CLK180

CLK270

SEMICONDUCTOR SYSTEM

CROSS-REFERENCES TO RELATED APPLICATION

This application is a division of U.S. patent application Ser. No. 13/308,843 filed on Dec. 1, 2011, which claims priority under 35 U.S.C. §119(a) to Korean application number 10-2011-0096135, filed on Sep. 23, 2011, in the Korean Intellectual Property Office. The disclosure of each of the foregoing application is incorporated herein by reference in its entirety as set forth in full.

BACKGROUND

1. Technical Field

The present invention relates to a semiconductor system, and more particularly, to a semiconductor system including a controller and a memory.

2. Related Art

A controller and a memory in a semiconductor system communicate with each other through a plurality of channels. The channels include a command channel for transmitting a command signal, a clock channel for transmitting a clock signal, a data channel for transmitting a data signal, and so forth. The controller transmits a clock signal to the memory and transmits a command signal and a data signal in synchronization with the clock signal. The memory receives the clock signal through the clock channel, and receives the command signal and the data through the command channel and the data channel, respectively, in synchronization with the clock signal. Accordingly, the controller and the memory can communicate with each other based on the clock signal.

FIG. 1 is an exemplary timing diagram showing clock signals transmitted from a controller to a memory through channels and internal clock signals generated within the memory. The controller transmits a first clock signal HCLK and a second clock signal WCLK to the memory. The second clock signal WCLK is a clock that may be used for data input/output operations, and the first clock HCLK is a clock signal that may be used for operations other than the data input/output operations. The memory receives the first and second clock signals HCLK and WCLK and generates first and second internal clock signals CLK0 and CLK90. The first and second clock signals CLK0 and CLK90 are generated, for example, to allow the memory to perform a double data rate (DDR) operation. The phase difference between the first and second clock signals CLK0 and CLK90 is 90°, and data can be inputted and outputted in synchronization with the rising edge and the falling edge of the second clock signal WCLK.

The controller generates and outputs the second clock signal WCLK, which has the same phase as the first clock signal HCLK and twice the frequency of the first clock signal HCLK, for high speed data communication with the memory. A clock generation unit is provided in the memory to receive the first and second clock signals HCLK and WCLK and to generate the first and second internal clock signals CLK0 and CLK90. The clock generation unit generates two clock signals, one signal with a 90° phase shift, because the memory does not operate internally with a clock at the same frequency of the second clock signal WCLK.

The memory provides feedback information to the controller regarding whether the first and second clock signals HCLK and WCLK have a corresponding phase. When the phases of the first and second clock signals HCLK and WCLK do not correspond to each other, a training operation is performed to correct the first and second clock signals HCLK and WCLK so that the first and second clock signals HCLK and WCLK correspond in phase. Therefore, the controller and the memory may have circuits that perform the training operation.

FIGS. 2a and 2b are timing diagrams respectively showing situations where first and second internal clock signals are normally generated and where the first and second internal clock signals are generated with erroneous timing, with respect to a power-down mode exit time. The memory may operate in a power-down mode to reduce power consumption, and data communication is not performed in the power-down mode. The memory operates in power-down mode when the power down signal PWRDN is at a high level. Accordingly, the memory may not receive the second clock signal WCLK in the power-down mode. When the memory no longer operates in the power-down mode, the memory may receive the first and second clock signals HCLK and WCLK and generate the first and second internal clock signals CLK0 and CLK90. Referring to FIG. 2A, the memory generates the first internal clock signal CLK0 at the rising edge of the second clock WCLK. When the power-down signal PWRDN changes to a low level (Power down mode exit) during a low level duration of the first clock signal HCLK, the first internal clock signal CLK0 may be normally generated at the rising edges of the first clock signal HCLK and the second clock signal WCLK.

Conversely, referring to FIG. 2B, when the power down exit happens during a high level duration of the first clock signal HCLK, the first internal clock signal CLK0 is generated at the falling edge of the first clock signal HCLK and the rising edge of the second clock signal WCLK. In this situation, the memory creates erroneous timing. In response to the erroneous timing, the controller may transmit a command to the memory to invert the phases of the first internal clock signal CLK0 and the second internal clock signal CLK90 to generate the first internal clock signal CLK0 at the rising edges of the first clock signal HCLK and the second clock signal WCLK.

SUMMARY

A semiconductor system including channels for transmitting multi-phase clocks is described in the following disclosure.

In an exemplary embodiment of the present invention, a semiconductor system includes: a first clock channel configured to transmit a first clock signal from a controller to a memory; and a second clock channel configured to transmit a second clock signal with a phase difference of 90° from the first clock signal, from the controller to the memory.

In another exemplary embodiment of the present invention, a semiconductor system includes: a first clock channel configured to transmit a first clock signal from a controller to a memory; a second clock channel configured to transmit a second clock signal with the same frequency as the first clock signal, from the controller to the memory; and a third clock channel configured to transmit a third clock signal with the same frequency as the second clock signal and a different phase from the second clock signal, from the controller to the memory.

In another exemplary embodiment of the present invention, a semiconductor system includes: a controller configured to output a first clock signal and a second clock signal with a phase difference of 90° from the first clock signal, in a normal mode; and a memory configured to operate in response to the first and second clock signals.

In another exemplary embodiment of the present invention, a semiconductor system includes: a controller configured to output a first clock signal, a second clock signal with the same frequency as the first clock signal, and a third clock signal with the same frequency as the second clock signal and a different phase from the second clock signal, in a normal mode; and a memory configured to operate in response to the first through third clock signals.

BRIEF DESCRIPTION OF THE DRAWINGS

Features, aspects, and embodiments are described in conjunction with the attached drawings, in which.

DETAILED DESCRIPTION

In the following disclosure, a semiconductor system according to the present invention will be described below with reference to the accompanying drawings through exemplary embodiments.

Figure 1:
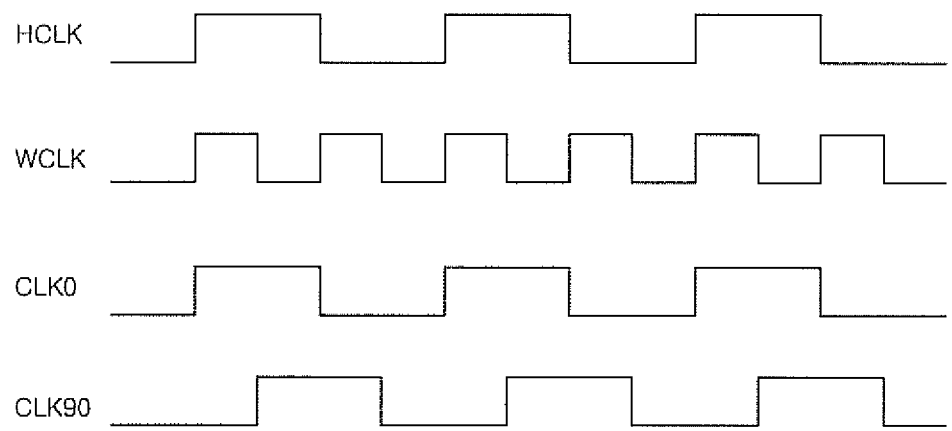
FIG. 1 is a timing diagram exemplarily illustrating clock signals transmitted from a controller to a memory through channels and internal clock signals generated in the memory.
Figure 2A:
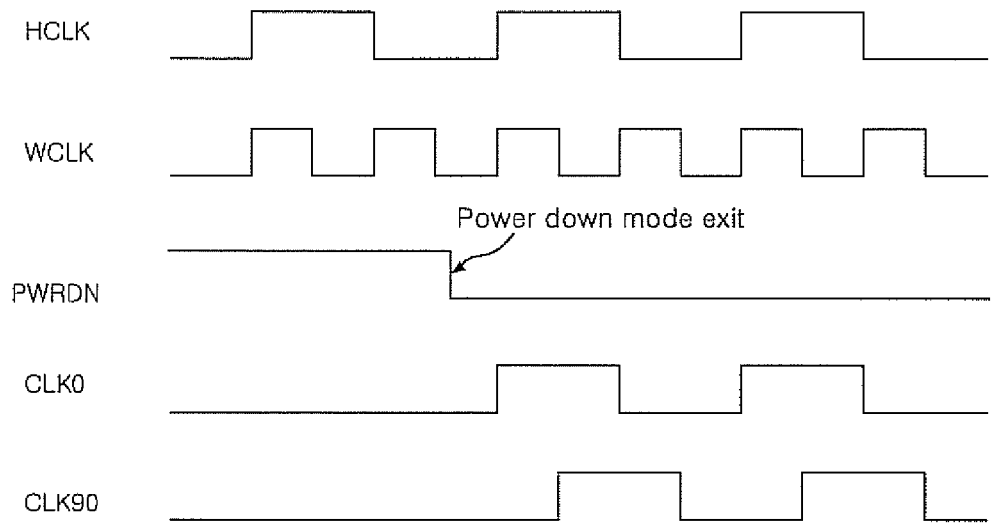
FIGS. 2a and 2b are timing diagrams respectively illustrating the cases where first and second internal clock signals are normally generated and where first and second internal clock signals are generated at erroneous timing, with respect to a power-down mode exit time.
Figure 2B:
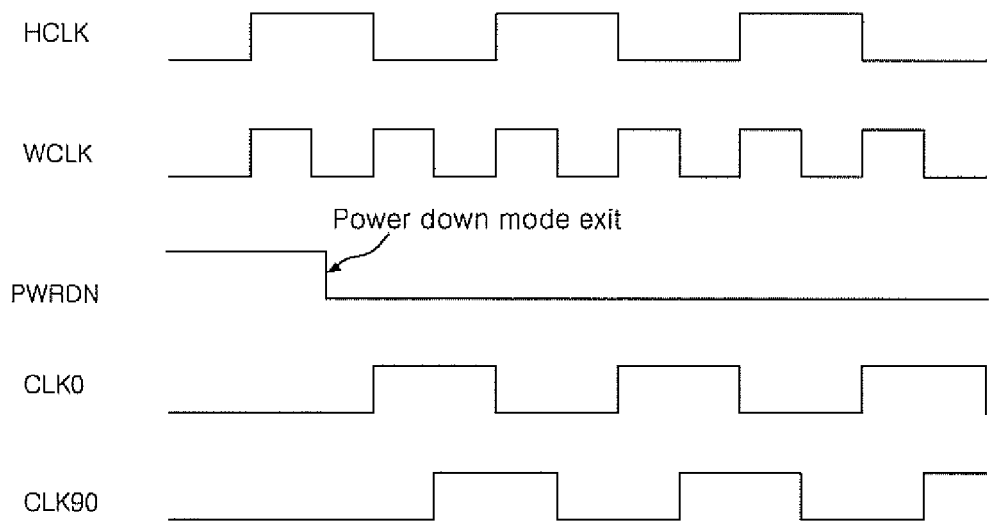
Figure 3:
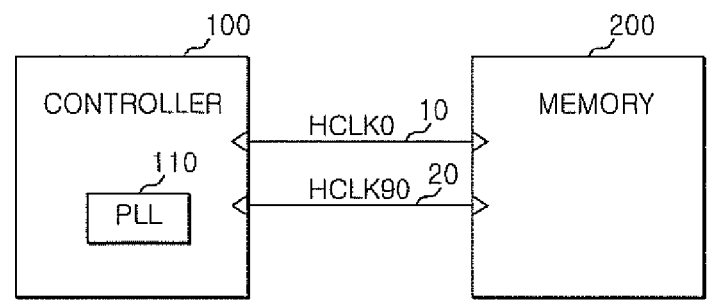
FIG. 3 is of a schematic block diagram of a semiconductor system in accordance with an exemplary embodiment of the present invention and a timing diagram illustrating clock signals transmitted through channels.
Figure 3:
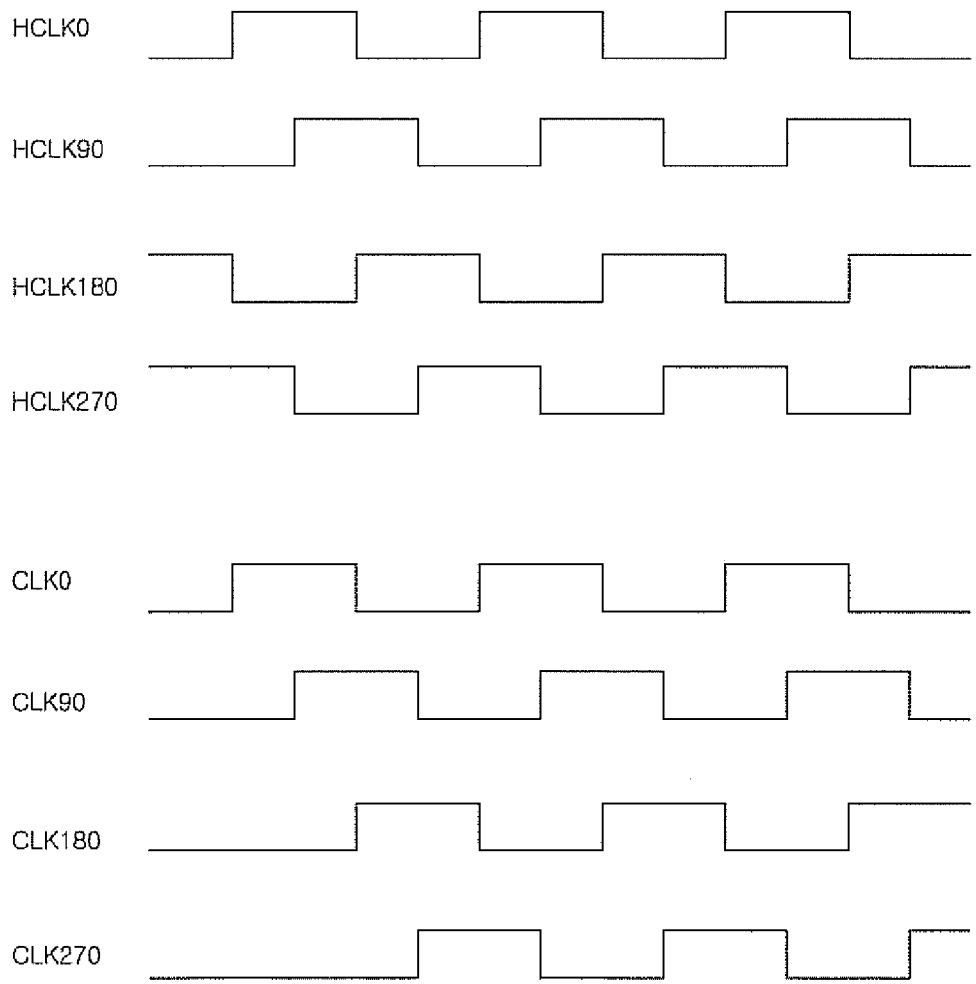

Referring to FIG. 3, the semiconductor system includes a controller 100 and a memory 200. The controller 100 and the memory 200 communicate with each other through a plurality of channels. The plurality of channels may include a command channel, a clock channel, a data channel, and so forth. The controller 100 and the memory 200 may communicate with each other by transmitting signals through the plurality of channels. In FIG. 3, the clock channel is shown. The clock channel includes first and second clock channels 10 and 20. The memory 200 may receive the clock signals output from the controller 100 through the clock channels 10 and 20 and may operate in synchronization with the controller 100.

The controller 100 outputs a first clock signal HCLK0 through the first clock channel 10 to the memory 200. The controller 100 outputs a second clock signal HCLK90 to the memory 200 through the second clock channel 20.

In an embodiment of the present invention, the first clock signal HCLK0 and the second clock signal HCLK90 have the same frequency. The second clock signal HCLK90 has a phase difference of 90° from the first clock signal HCLK0. The controller 100 includes a phase-locked loop (PLL) circuit 110. The first and second clock signals HCLK0 and HCLK90 are generated by the phase-locked loop circuit 110. The phase-locked loop circuit 110 may be capable of generating a multi-phase clock. Since controller 100 has the phase-locked loop circuit 110, a separate clock generation circuit is not included in addition to the phase-locked loop circuit 110 in the controller 100 or the memory 200 to generate the first clock signal HCLK0 and the second clock signal HCLK90.

The memory 200 may receive the first clock signal HCLK0 and the second clock signal HCLK90 and may generate four internal clock signals CLK0, CLK90, CLK180 and CLK270. The memory may use a differential clock signal HCLK180 of the first clock signal HCLK0 and a differential clock signal HCLK270 of the second clock signal HCLK90 to generate the four internal clock signals CLK0, CLK90, CLK180 and CLK270. The internal clock signals CLK90, CLK180, and CLK270 each sequentially have an additional 90° of phase difference from CLK0. The internal clock signals CLK0, CLK90, CLK180 and CLK270 are used when the memory 200 receives data from the controller 100 and outputs data to the controller 100.

The memory 200 may enter a power-down mode or exit the power-down mode to enter a normal mode under the control of the controller 100. The power-down mode may be referred to as a low power consumption mode or a standby mode, and may be a mode where power consumption by the memory 200 is reduced. The normal mode may be all modes or operating states excluding the power-down mode. In the power-down mode, the memory 200 does not perform data communication with the controller 100. When the memory 200 exits the power-down mode to enter the normal mode, the memory 200 may be quickly reset to prepare for communication with the controller 100. In the power-down mode, the controller 100 may output the first clock signal HCLK0 but may not output the second clock signal HCLK90. Accordingly, since the controller 100 outputs only the first clock signal HCLK0, power consumption may be reduced because the controller does not toggle the second clock signal HCLK90.

In the normal mode, the controller 100 outputs both the first and second clock signals HCLK0 and HCLK90, and the memory 200 receives both the first and second clock signals HCLK0 and HCLK90. The memory 200 may immediately generate the internal clock signals CLK0, CLK90, CLK180 and CLK270 for data communication by receiving the first and second clock signals HCLK0 and HCLK90. The internal clock signals CLK180 and CLK270 may be generated through circuits that invert the internal clock signals CLK0 and CLK90 or may be generated from clock signals that are transmitted from the controller 100 to the memory 200 through separate clock channels.

In an embodiment of the present invention, the controller 100 may further output third and fourth clock signals HCLK180 and HCLK270. Also, the semiconductor system may further include third and fourth clock channels (not shown) for transmitting the third and fourth clock signals HCLK180 and HCLK270 to the memory 200. The third clock signal HCLK180 has a phase difference of 180° from the first clock signal HCLK0, and the fourth clock signal HCLK270 has a phase difference of 270° from the first clock signal HCLK0. The four internal clock signals CLK0, CLK90, CLK180 and CLK270 may be immediately generated by receiving the four clock signals HCLK0, HCLK90, HCLK180 and HCLK270 through the four clock channels. In other words, a clock generation unit, to generate the internal clocks CLK0, CLK90, CLK180 and CLK270 for data input/output operations, is not included in the memory 200. Moreover, when the memory 200 switches from power-down mode to normal mode, the internal clocks CLK0, CLK90, CLK180 and CLK270 may be immediately generated by receiving the first through fourth clocks HCLK0, HCLK90, HCLK180 and HCLK270. Therefore, when the memory 200 switches from power-down mode to normal mode, a quick reset may be performed.

Figure 4:
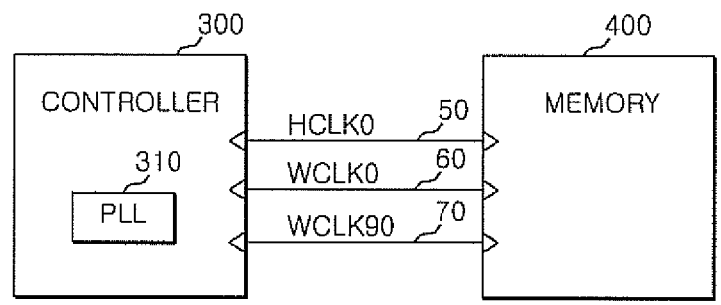
FIG. 4 is of a schematic block diagram of a semiconductor system in accordance with another exemplary embodiment of the present invention and a timing diagram illustrating clock signals transmitted through channels.
Figure 4:
Figure 4:
Figure 4:
Figure 4:
Figure 4:
Figure 4:
Figure 4:
Figure 4:
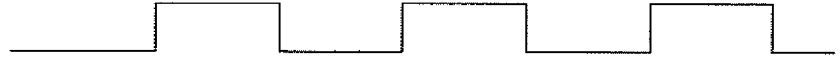
Figure 4:
Figure 4:

Referring to FIG. 4, the semiconductor system includes a controller 300, a memory 400, first, second, and third clock channels 50, 60 and 70. The controller 300 generates and outputs first, second, and third clock signals HCLK0, WCLK0 and WCLK90. The first, second, and third clock channels 50, 60 and 70 respectively transmit the first, second, and third clock signals HCLK0, WCLK0 and WCLK90, and the memory 400 receives the first, second, and third clock signals HCLK0, WCLK0 and WCLK90.

In an embodiment of the present invention, the second clock signal WCLK0 has the same frequency as the first clock signal HCLK0. The third clock signal WCLK90 has the same frequency as the second clock signal WCLK0 but has a different phase from the second clock signal WCLK0. The third clock signal WCLK90 may have a phase difference of 90° from the second clock signal WCLK0.

The second and third clock signals WCLK0 and WCLK90 are clock signals used when the memory 400 receives data from the controller 300 or outputs data to the controller 300. The first clock signal HCLK0 is a clock signal used for operations other than the data input/output operations of the memory 400, and, for example, may be a clock signal used to process signals, such as a command signal and an address signal received from the controller 300. For the data input/output operations of the memory 400, clock signals other than the first clock signal HCLK0 may be used to communicate with the controller 300. Moreover, in the memory 400, a circuit block for data input/output operations and a circuit block for the other operations are separated from each other in terms of position and structure. The separate clock signals for data input/output operations and the clock signal for processing the command and address signals facilitates communication between the controller 300 and the memory 400.

The first, second, and third clock signals HCLK0, WCLK0 and WCLK90 may be generated from a phase-locked loop circuit 310 that is included in the controller 300. The memory 400 may receive the second clock signal WCLK0 and the third clock signal WCLK90 and generate four internal clock signals CLK0, CLK90, CLK180 and CLK270. The memory 400 may use a differential clock signal WCLK180 of the second clock signal WCLK0 and a differential clock signal WCLK270 of the third clock signal WCLK90 to generate the four internal clock signals CLK0, CLK90, CLK180 and CLK270. The internal clock signals CLK90, CLK180, and CLK270 each sequentially have an additional 90° of phase difference from CLK0. These internal clock signals CLK0, CLK90, CLK180 and CLK270 are used when the memory 400 receives data from the controller 300 and outputs data to the controller 300.

During a power-down mode, the controller 300 outputs the first clock signal HCLK0 but does not output the second and third clock signals WCLK0 and WCLK90, and the memory 400 receives the first clock signal HCLK0 and does not receive the second and third clock signals WCLK0 and WCLK90.

If the semiconductor system switches from power-down mode to normal mode, the memory 400 receives the first, second, and third clock signals HCLK0, WCLK0 and WCLK90 from the controller 300. The memory 400 receives the second and third clock signals WCLK0 and WCLK90 and generates the internal clock signals CLK0, CLK90, CLK180 and CLK270. The memory 400 may immediately generate the internal clock signals CLK0, CLK90, CLK180 and CLK270 based on the second and third clock signals WCLK0 and WCLK90. The internal clock signals CLK180 and CLK270 may be generated through circuits for inverting the internal clock signals CLK0 and CLK90 in the memory 400 or may be generated from clock signals which are transmitted from the controller 300 to the memory 400 through separate clock channels.

The semiconductor system may further include a fourth clock channel for transmitting a fourth clock signal HCLK180 with a phase difference of 180° from the first clock signal HCLK0. The semiconductor system may further include a fifth clock channel for transmitting a fifth clock signal WCLK180 with a phase difference of 180° from the second clock signal WCLK0. The semiconductor system may further include a sixth clock channel for transmitting a sixth clock signal WCLK270 with a phase difference of 180° from the third clock signal WCLK90.

Since the controller 300 may generate the first through sixth clock signals HCLK0, WCLK0, WCLK90, HCLK180, WCLK180 and WCLK270 using the phase-locked loop circuit 310, the controller 300 does not have separate clock generation circuits. Since the memory 400 may generate the internal clock signals CLK0, CLK90, CLK180 and CLK270 based on the first through sixth clock signals HCLK0, WCLK0, WCLK90, HCLK180, WCLK180 and WCLK270 immediately when switching from power-down mode to normal mode, the memory 400 does not need a separate clock generation circuit. Furthermore, the semiconductor system does not need a training operation between the controller 300 and the memory 400 and a circuit for the training operation.

As is apparent from the above description, since additional circuits for training operations are not included, a circuit area may be made available. Also, when switching from power-down mode to normal mode, the memory is capable of performing a quick reset. Further, power consumption is reduced since clock signals that are transmitted through the channels have a constant frequency.

While certain embodiments have been described above, it will be understood to those skilled in the art that the embodiments described are by way of example only. Accordingly, the semiconductor system described herein should not be limited based on the described embodiments. Rather, the semiconductor system described herein should only be limited in light of the claims that follow when taken in conjunction with the above description and accompanying drawings.

What is claimed is:
1. A semiconductor system comprising:
 a first clock channel configured to transmit a first clock signal from a controller to a memory;
 a second clock channel configured to transmit a second clock signal with the same frequency and same phase as the first clock signal, from the controller to the memory; and
 a third clock channel configured to transmit a third clock signal with the same frequency as the second clock signal and a different phase from the second clock signal, from the controller to the memory,
 wherein the memory is configured to perform data input/output operations in response to the second and third clock signals, and uses the first clock signal when performing operations excluding the data input/output operations.
2. The semiconductor system according to claim 1, wherein the third clock signal has a phase difference of 90 degrees from the second clock signal.

3. The semiconductor system according to claim 1, wherein the first through third clock signals are generated by a phase-locked loop circuit that is included in the controller.

4. The semiconductor system according to claim 1, further comprising:
a fourth clock channel configured to transmit a fourth clock signal with a phase difference of 180 degrees from the first clock signal, from the controller to the memory.

5. The semiconductor system according to claim 1, further comprising:
a fifth clock channel configured to transmit a fifth clock signal with a phase difference of 180 degrees from the second clock signal, from the controller to the memory.

6. The semiconductor system according to claim 5, further comprising:
a sixth clock channel configured to transmit a sixth clock signal with a phase difference of 180 degrees from the third clock signal, from the controller to the memory.

7. The semiconductor system according to claim 1, wherein the memory uses the second and third clock signals for data input/output operations and uses the first clock signal for operations other than the data input/output operations.

8. A semiconductor system comprising:
a controller configured to output a first clock signal, a second clock signal with the same frequency and the same phase as the first clock signal, and a third clock signal with the same frequency as the second clock signal and a different phase from the second clock signal, in a normal mode; and
a memory configured to operate in response to the first through third clock signals,
wherein the memory is configured to perform data input/output operations in response to the second and third clock signals, and uses the first clock signal when performing operations excluding the data input/output operations.

9. The semiconductor system according to claim 8, wherein the third clock signal has a phase difference of 90 degrees from the second clock signal.

10. The semiconductor system according to claim 8, wherein the controller includes a phase-locked loop circuit that generates the first through third clock signals.

11. The semiconductor system according to claim 8, wherein the controller configured to output the first clock signal and does not output the second and third clock signals in a power-down mode.

12. The semiconductor system according to claim 8, wherein the controller further outputs a fourth clock signal with a phase difference of 180 degrees from the first clock signal, a fifth clock signal with a phase difference of 180 degrees from the second clock signal, and a sixth clock signal with a phase difference of 180 degrees from the third clock signal.

13. The semiconductor system according to claim 8, wherein the memory configured to receive the first through third clock signals and generates a first internal clock signal, a second internal clock signal, a third internal clock signal, and a fourth internal clock signal.

14. The semiconductor system according to claim 13, wherein the first through fourth internal clock signals are immediately generated by receiving the first through third clock signals from the controller.

* * * * *